US009776850B2

(12) United States Patent
Richie et al.

(10) Patent No.: US 9,776,850 B2
(45) Date of Patent: Oct. 3, 2017

(54) SYSTEM, METHOD AND APPARATUS FOR VERIFYING GROUNDWIRE CONNECTIONS ON A VEHICLE

(71) Applicant: ShaleApps, LLC, Bloomfield Hills, MI (US)

(72) Inventors: James Chance Richie, Bloomfield Hills, MI (US); Adam M. Klenk, Morgantown, WV (US); Anthony Gutta, Maidsville, WV (US)

(73) Assignee: ShaleApps, LLC, Denver, CO (US)

( * ) Notice: Subject to any disclaimer, the term of this patent is extended or adjusted under 35 U.S.C. 154(b) by 343 days.

(21) Appl. No.: 14/559,143

(22) Filed: Dec. 3, 2014

(65) Prior Publication Data

US 2015/0153402 A1 Jun. 4, 2015

Related U.S. Application Data

(60) Provisional application No. 61/911,023, filed on Dec. 3, 2013.

(51) Int. Cl.
*G01R 31/02* (2006.01)
*B67D 7/32* (2010.01)

(52) U.S. Cl.
CPC .................................. *B67D 7/3236* (2013.01)

(58) Field of Classification Search
CPC ...... G01R 31/02; G01R 31/00; G01R 31/025; G01R 31/006; G01R 31/28; B67D 7/3236; H01R 9/2691; H01R 9/2483; H01L 24/34; G01L 19/0061; F24C 15/104

See application file for complete search history.

(56) References Cited

U.S. PATENT DOCUMENTS 4,072,929 A * 2/1978 Garmong ............... B67D 7/228 340/5.54
2006/0215346 A1* 9/2006 Yang .................... B67D 7/3236 361/228
2010/0089486 A1* 4/2010 Koeninger ........... B67D 7/3209 141/2
2011/0120589 A1* 5/2011 Evans ................. G05D 7/0617 141/1

* cited by examiner

*Primary Examiner* — Son Le
(74) *Attorney, Agent, or Firm* — The Webb Law Firm

(57) ABSTRACT

The present invention relates to a method, system, and apparatus for verifying a groundwire connection prior to transferring a fluid between a tank and a reservoir. The system may comprise a vehicle comprising a tank and a groundwire, the groundwire comprising a first communicating member, a grounding unit configured to electrically ground the vehicle when the groundwire is connected thereto, the grounding unit comprising a second communicating member, and at least one processor in communication with at least one of the first communicating member and the second communicating member. The at least one processor may be configured to determine whether the groundwire is connected to the grounding unit, and facilitate fluid transfer between the tank and the reservoir based at least partially on the determination.

24 Claims, 3 Drawing Sheets

SYSTEM, METHOD AND APPARATUS FOR VERIFYING GROUNDWIRE CONNECTIONS ON A VEHICLE

CROSS REFERENCE TO RELATED APPLICATIONS

This application claims benefit of priority from U.S. Provisional Application No. 61/911,023, filed Dec. 3, 2013, which is incorporated herein by reference in its entirety.

BACKGROUND OF THE INVENTION

Field of the Invention

This invention relates generally to electrical grounding systems for vehicles involved in the transportation of fluids and, more specifically, to a system, apparatus, and method for verifying a groundwire connection on a vehicle.

Description of Related Art

Discharge of static electricity can potentially create highly dangerous conditions in industries dealing with flammable substances. Particularly, static electricity can build up due to the flowing movement of finely powdered substances or low conductivity fluids in pipes or through mechanical agitation. Additionally, static charge may build up on a vehicle simply due to friction between the vehicle and any occupants or items contained therein. Flammable vapor clouds and clouds of finely powdered flammable substances can become combustible, and explosions have occurred due to static discharge in such dust or vapor clouds.

Significant contact-induced charge separation, or flow electrification, occurs when low conductivity fluids flow through pipelines or are mechanically agitated. Particularly, non-polar liquids, such as kerosene, gasoline, diesel, and light crude oils, as examples, often exhibit high levels of charge accumulation. However, charge accumulation may occur during the transfer of other fluids as well, including water and hydraulic fracturing fluids. The amount of charge accumulation increases at higher fluid velocities and larger pipe diameters, and accordingly, static charge generation in these systems is often controlled by limiting fluid velocity. Further, in many systems, an anti-static additive must be added to the fluid.

One way to reduce the risk of charge build-up is to electrically ground vehicles, particularly those engaged in fluid transfer, by providing a low-resistance pathway for electricity to travel between the machinery and the ground. However, such systems depend on the vehicle operator manually connecting a groundwire, and the need for doing so may not be readily apparent to vehicle operators.

Particularly in hydraulic fracturing operations, each well may be located at a remote location and such operations may require hundreds of trucks engaged in the transportation of water and/or hydraulic fracturing fluids to and from the well site. Accordingly, in such operations, it is particularly difficult to maintain accountability of the vehicle operators and ensure they follow the proper safety precautions, including grounding the vehicle prior to fluid transfer.

SUMMARY OF THE INVENTION

Generally, provided is a system, method, and apparatus for verifying a groundwire connection to a vehicle that represent an improvement over existing systems and configurations. Preferably, provided is a system, method, and apparatus for verifying a groundwire connection to a vehicle that can be implemented prior to transferring a fluid between a tank and a reservoir. The system, method, and apparatus for verifying a groundwire connection to a vehicle may also provide the user with the ability to monitor and control fluid transfer between a tank and a reservoir from a remote location. The system, method, and apparatus for verifying a groundwire connection to a vehicle may also provide the user with the ability to monitor the location, fluid transfer activities, and adherence to grounding procedures of a plurality of vehicles at a plurality of reservoirs. The system, method, and apparatus for verifying a groundwire connection to a vehicle may ensure that only authorized vehicles, which are equipped with the correct communicating member, will be capable of unloading or loading a fluid into or from the reservoir via a manifold.

In one preferred and non-limiting embodiment or aspect, provided is a system for verifying a groundwire connection prior to transferring a fluid between a tank and a reservoir. The system may include a first communicating member adapted to be attached to a groundwire of a vehicle which houses the tank, a grounding unit configured to electrically ground the vehicle when the groundwire is connected thereto, a second communicating member attached to the grounding unit, and at least one processor in communication with at least one of the first communicating member and the second communicating member. The at least one processor may be programmed and/or configured to determine whether the groundwire is connected to the grounding unit based at least partially upon data received from at least one of the first communicating member and the second communicating member, and facilitate fluid transfer between the tank and the reservoir in response to determining that the groundwire is connected to the grounding unit.

The system may further include a valve in communication with the at least one processor, and the valve may be configured to restrict the flow of the fluid between the reservoir and the tank. The facilitation of fluid transfer between the tank and the reservoir may be accomplished by opening the valve or releasing a locking arrangement that allows for the valve to be manually opened.

In a non-limiting embodiment or aspect of the system, the valve may be adapted to be opened manually, and the at least one processor may be further programmed and/or configured to prevent, with the locking arrangement, the valve from being manually opened when the groundwire is not connected to the grounding unit. In a non-limiting embodiment or aspect of the system, at least one of the first communicating member and the second communicating member may include at least one receiver adapted to receive at least one of a radio frequency, barcode data, or any combination thereof. In a non-limiting embodiment or aspect of the system, at least one of the first communicating member and the second communicating member may include aa radio frequency transmitter, a Bluetooth transmitter, a near field communication transmitter, a barcode, or any combination thereof.

In a non-limiting embodiment or aspect of the system, the at least one processor may be further programmed and/or configured to determine at least one of a time at which the groundwire is connected to the grounding unit, a time at which the groundwire is disconnected from the grounding unit, the duration for which the groundwire is attached to the grounding unit, or any combination thereof. In a non-limiting embodiment or aspect of the system, the system may further include a manifold connected to the reservoir and the tank such that the fluid can flow between the tank and the reservoir via the manifold. The manifold may include at least one of: the grounding unit, an automated valve, a flow meter, or any combination thereof.

In a non-limiting embodiment or aspect of the system, the second communicating member may include a receiver, the first communicating member may include a transmitter, and the second communicating member may be in communication with the at least one processor. In a non-limiting embodiment or aspect, the system may further include a flow meter in communication with the at least one processor, the at least one processor may be further programmed and/or configured to determine at least one of a flow rate and a flow volume of the fluid transferred between the reservoir and the tank. In a non-limiting embodiment or aspect, the system may further include a third communicating member adapted to be attached to a second groundwire connected to a second vehicle, and the at least one processor may be further programmed and/or configured to determine which of the first and second vehicles is connected to the grounding unit. In a non-limiting embodiment or aspect, the system may further include a second grounding unit comprising another communicating member in communication with the at least one processor, and the at least one processor may be further programmed and/or configured to determine which of the first and second grounding units the vehicle is connected to.

In a non-limiting embodiment or aspect of the system, the at least one processor may be further programmed and/or configured to communicate, to at least one remote server computer via at least one network, at least one of: a time at which the groundwire is connected to the grounding unit, a time at which the groundwire is disconnected from the grounding unit, a duration for which the groundwire has been connected to the grounding unit, a flow rate of a fluid between a reservoir and a tank located on the vehicle, a volume of a fluid that has been transferred between a reservoir and a tank located on the vehicle, an identity of the vehicle, or any combination thereof. In a non-limiting embodiment or aspect of the system, the at least one processor may be further programmed and/or configured to record at least one of the following: an identity of the vehicle, a driver of the vehicle, an indication as to whether the groundwire had been connected to the grounding unit during fluid transfer, or any combination thereof.

In an additional preferred and non-limiting embodiment or aspect, provided is a method for verifying a groundwire connection prior to transferring a fluid between a tank and a reservoir using a grounding unit configured to electrically ground a vehicle. The method may include: determining, with at least one processor, whether a groundwire is connected to the grounding unit based at least partially on data received from at least one communicating member affixed to at least one of the groundwire and the grounding unit, in response to determining that the groundwire is connected to the grounding unit, causing or allowing a valve to be opened such that fluid is permitted to flow between the reservoir and the tank, and in response to determining that the groundwire is not connected to the grounding unit, causing or forcing the valve to remain closed such that fluid is not permitted to flow between the reservoir and the tank.

In a non-limiting embodiment or aspect, the method may further include determining, using a flow meter, at least one of the rate of flow and the volume of flow of the fluid transferred between the reservoir and the tank.

In a non-limiting embodiment or aspect, the method may further include determining, with at least one processor, at least one of the following: a time at which the groundwire is connected to the grounding unit, a time at which the groundwire is disconnected from the grounding unit, the duration for which the groundwire is attached to the grounding unit, or any combination thereof.

In a non-limiting embodiment or aspect, the method may further include communicating, to at least one server computer via at least one network, at least one of the following: a time at which the groundwire is connected to the grounding unit, a time at which the groundwire is disconnected from the grounding unit, a duration for which the groundwire has been connected to the grounding unit, a flow rate of a fluid between a reservoir and a tank located on the vehicle, a volume of a fluid that has been transferred between a reservoir and a tank located on the vehicle, an identity of the vehicle, or any combination thereof.

In a non-limiting embodiment or aspect, the method may further include: recording an identity of the vehicle or the driver of the vehicle in at least one database; and recording an indication that the groundwire has been connected to the grounding unit in the at least one database.

In a further preferred and non-limiting embodiment or aspect of the present invention, provided is an apparatus adapted to restrict the flow of a fluid between a tank and a reservoir based on a groundwire connection. The apparatus may include a grounding unit adapted to electrically ground a vehicle when a vehicle groundwire is connected thereto, a conduit having a first end adapted to be releasably connected to a tank of a vehicle, a second end adapted to be connected to a reservoir, and a valve therebetween. The valve may be configured to open and allow a fluid to flow therethrough when the vehicle groundwire is connected to the grounding unit.

In a non-limiting embodiment or aspect of the apparatus, the conduit may further include at least one of a second valve adapted to be manually opened or closed by a user, and a check valve configured to restrict the flow of the fluid from the reservoir to the tank or from the tank to the reservoir.

In a non-limiting embodiment or aspect of the apparatus, the apparatus may further include a flow meter adapted to measure at least one of a rate of flow and a volume of flow of a fluid through the conduit.

In a non-limiting embodiment or aspect of the apparatus, at least one of the grounding unit and the automated valve may be adapted to communicate to at least one processor at least one of the following: a time at which the groundwire is connected to the grounding unit, a time at which the groundwire is disconnected from the grounding unit, a duration for which the groundwire has been connected to the grounding unit, an identity of the vehicle associated with the groundwire, or any combination thereof.

In a non-limiting embodiment or aspect of the apparatus, the flow meter may be adapted to communicate to at least one processor at least one of the following: a rate of flow of a fluid through the conduit, a volume of flow of a fluid through the conduit, an indication that a fluid is flowing through the conduit, a time at which a fluid began flowing through the conduit, a time at which a fluid ceased flowing through the conduit, a duration for which a fluid flowed through the conduit, or any combination thereof.

In a non-limiting embodiment or aspect of the apparatus, the valve may be an automated valve configured to automatically open when the vehicle groundwire is connected to the grounding unit.

These and other features and characteristics of the present invention, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and the claims, the singular form of "a", "an", and "the" include plural referents unless the context clearly dictates otherwise.

DETAILED DESCRIPTION OF THE PREFERRED EMBODIMENTS OR ASPECTS

Figure 1:
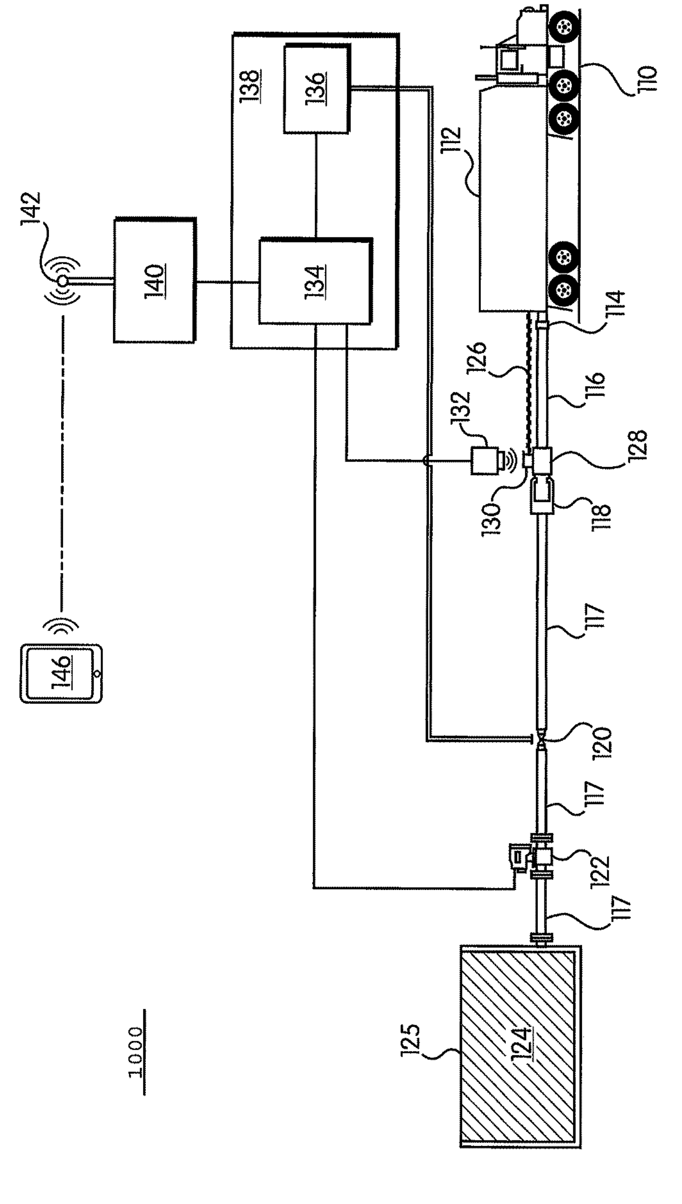
FIG. 1 shows a system diagram of a non-limiting embodiment or aspect according to the principles of the present invention.

For purposes of the description hereinafter, the terms "upper", "lower", "right", "left", "vertical", "horizontal", "top", "bottom", "lateral", "longitudinal", and derivatives thereof shall relate to the invention as it is oriented in the drawing figures. However, it is to be understood that the invention may assume various alternative variations and step sequences, except where expressly specified to the contrary. It is also to be understood that the specific devices and processes illustrated in the attached drawings, and described in the following specification, are simply exemplary embodiments or aspects of the invention. Hence, specific dimensions and other physical characteristics related to the embodiments or aspects disclosed herein are not to be considered as limiting.

As used herein, the terms "communication" and "communicate" refer to the receipt or transfer of one or more signals, messages, commands, or other type of data. For one unit or device to be in communication with another unit or device means that the one unit or device is able to receive data from and/or transmit data to the other unit or device. A communication may use a direct or indirect connection, and may be wired and/or wireless in nature. Additionally, two units or devices may be in communication with each other even though the data transmitted may be modified, processed, routed, etc., between the first and second unit or device. For example, a first unit may be in communication with a second unit even though the first unit passively receives data, and does not actively transmit data to the second unit. As another example, a first unit may be in communication with a second unit if an intermediary unit processes data from one unit and transmits processed data to the second unit. It will be appreciated that numerous other arrangements are possible.

As used herein, the term "fluid" may refer to any type of transportable liquid, gas, or mixture including a liquid or gas such as, but not limited to, water, crude oil, natural gas, gasoline, toluene, diesel, kerosene, propane, and/or hydraulic fracturing fluid. In a preferred and non-limiting embodiment or aspect, fluid may be water used in the hydraulic fracturing process for obtaining natural resources from the earth, including fresh water that is transported from a reservoir to a well, and/or contaminated fracking water that is transported from a well to a water treatment, disposal, and/or storage facility. Likewise, a reservoir may refer to any well, stream, river, spring, storage facility, treatment facility, tank, pit, pond, fueling station, barrel and/or other location having fluid and/or capable of receiving fluid.

Referring now to FIG. 1, a system 1000 for verifying a groundwire connection to a vehicle is shown according to a preferred and non-limiting embodiment or aspect. A vehicle 110 comprising at least one tank 112 is connected to a reservoir 125 via a conduit 116, such as a hose, pipe, and/or other type of conduit, which is releasably attached to a fixed conduit 117 via a coupling 118, such that a fluid 124 may be allowed to flow between the reservoir 125 and the tank 112. It is envisioned that the fluid 124 may flow either from the tank 112 to the reservoir 125 or from the reservoir 125 to the tank 112, and that the fluid 124 may be propelled by any means such as, for example, a pump, gravity, and/or an artificially or naturally induced pressure differential between the tank and reservoir.

Figure 4:
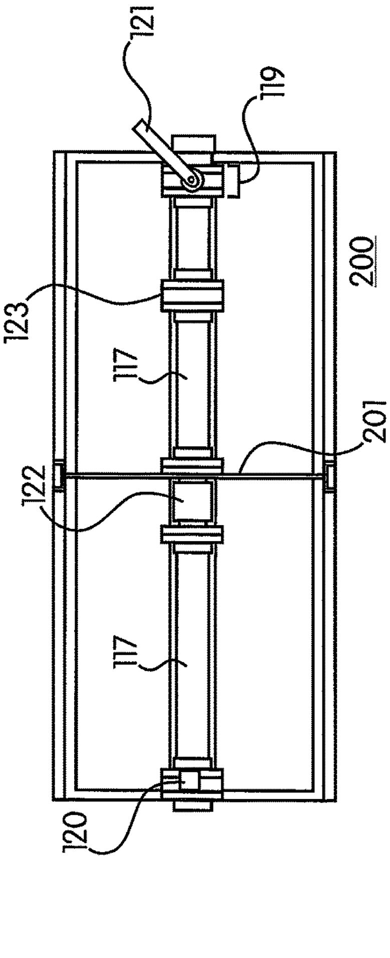
FIG. 4 shows a top view of the manifold shown in FIGS. 1 and 2.

In the non-limiting embodiment or aspect shown in FIG. 1, there are a plurality of valves 114, 120 configured to selectively restrict and allow a fluid 124 to flow between the reservoir 125 and the tank 112. However, it will be appreciated that one or more valves may be used in various arrangements to restrict and/or allow the fluid 124 to flow. In the non-limiting embodiment or aspect shown, a valve 114 is coupled to the tank 112, and the valve is adapted to be manually closed by a user, such that it can prevent fluid from flowing between the tank and the conduit 116, and manually opened such that it can allow fluid to flow between the tank and the hose 116. A second valve (not shown in FIG. 1; shown as 119 in FIGS. 2, 4, and 5), also adapted to be manually opened and closed by a user, may be part of the coupling mechanism 118, and the conduit 116 may be releasably connected to the fixed conduit 117.

With continued reference to FIG. 1, in the non-limiting embodiment or aspect shown, a third valve 120 is an automated valve and is in communication with a controller 136 and a server computer 140 via a network switch 134. The valve 120 and the network switch 134 are located on a control unit 138. The automated valve 120 is adapted to open and close based on instructions and/or commands received from the controller 136. It will be appreciated that various microprocessors, controllers, and/or other data processing devices may be used to issue instructions and/or commands, and that such devices may be located proximate to the system 1000, as shown in FIG. 1, or remote. The term "controller," as used herein, may refer to one or more programmable logic controllers, microprocessors, CPUs, computer workstations, server computers, and/or any other type of computing device.

The configuration shown with regard to the controller 136, the server computer 140, and the network switch 134 is for illustrative purposes only. It will be appreciated by those skilled in the art that other configurations are possible, including but not limited to configurations wherein the functionality of the controller, the server computer, and/or the network computer is consolidated into a single processor or split among several processors. Further, various types of hardware components and arrangements thereof may be used to perform the functions for carrying out the processes described herein. For example, the present system may be in communication with, utilize, and/or form a part of a fluid transportation management system such as those disclosed in U.S. Patent Application Publication Nos. 2014/0195453 and 2014/0195454 to Richie et al., both of which is hereby incorporated by reference herein in their entirety.

With continued reference to FIG. 1, the vehicle 110 comprises a groundwire 126, and the groundwire 126 comprises a first communicating member 130. The groundwire 126 may be releasably attached to a grounding unit 128 configured to electrically ground the vehicle 110 when the groundwire 128 is connected thereto. In a non-limiting embodiment or aspect, the grounding unit establishes an electrical connection between the groundwire 126 of the vehicle 110 and the Earth, the chassis of a manifold (e.g., 200 in FIGS. 2-5), or any other object or device that provides a return path for electric current. For example, the grounding unit 128 may comprise a conductive stake or rod which is inserted into the Earth to effectively ground the connection. However, it will be appreciated that various grounding systems known to those skilled in the art may be utilized in accordance with the present invention. For example, in alternative, non-limiting embodiments or aspects, the grounding unit 128 may be adapted to electrically connect the groundwire 128 to an artificial neutral grounding system, a power entry module, a galvanic isolation device, or any like system.

In a non-limiting embodiment or aspect, the grounding unit 128 comprises a second communicating member 132, which is in communication with the controller 136 and the server computer 140 via the network switch 134, or through any other suitable means for communication.

Still referring to FIG. 1, the first and second communicating members 130, 132 are envisioned to be any devices that may receive and/or transmit data when placed in proximity to one another. In non-limiting embodiments or aspects, one of the communicating members 130, 132 will transmit data while the other will receive data. In a preferred and non-limiting embodiment or aspect, the second communicating member 132 is a radio frequency identification reader and the first communicating member 130 is a radio frequency identification transmitter or transponder. Communicating members may also include, for example, visual indicia, such as a barcode or other printed data, and a device capable of reading the visual indicia, such as a barcode reader or an optical receiver capable of character recognition, a wireless signal transmitter and receiver, and/or the like. Bluetooth, including but not limited to low-energy Bluetooth, or other like protocols may also be used, and the signal strength of the Bluetooth may be used to determine proximity. In a further example, one communicating member may be a computing device that transmits data via near-field communication methods to the other communicating member, which is configured to receive such signals.

Other configurations are envisioned which may indicate to the at least one processor that the groundwire has been connected to the grounding unit. For example, a switch may be used on the grounding unit or connected to the groundwire that is electrically or physically actuated upon connection of the groundwire to the grounding unit. Moreover, a signal receiver (e.g., a communicating member) may be physically connected to the groundwire and/or the grounding unit to detect electrical changes, such as, but not limited to, changes in capacitance, resistance, current, and/or the like, that result from connecting the groundwire to the grounding unit. It will be appreciated that other methods are possible for detecting a physical connection between a groundwire and a grounding unit. As another example, the groundwire may be shaped in such a way that it corresponds with a specifically shaped aperture on the grounding unit similar to a key fitting into a lock. Within the aperture there may be an electrical or mechanical sensor for determining that the groundwire (or similarly shaped override key) is connected thereto, and thereupon the grounding unit may send a signal to the at least one processor that the groundwire has been connected to the grounding unit.

In the non-limiting embodiment or aspect shown in FIG. 1, the first communicating member 130 is a radio frequency transponder and the second communicating member 132 is a radio frequency reader. When the radio frequency transponder 130 is placed beneath the radio frequency reader 132 as the groundwire 126 is attached to the grounding unit 128 by the user, the radio frequency reader 132 indicates to the controller 136, and the server 140 via the network switch 134, that the groundwire 126 is attached to the grounding unit 128.

Upon receiving an indication from the radio frequency reader 132 that specific data has been received from the transponder 130, the controller 136 is configured to cause an automated valve 120 to open. Thus, in the non-limiting embodiment or aspect shown, only when the groundwire 126 has been connected to the grounding unit 128 and the user has opened two manual valves, is the fluid 124 able to flow between the tank and the reservoir.

The system 1000 ensures that the vehicle 110 is properly grounded prior to fluid transfer. An additional advantage of the system 1000 is that it may prevent unauthorized vehicles not equipped with the correct radio frequency transponder or other communicating member from transferring fluid to or from the reservoir. In a preferred non-limiting embodiment or aspect, the radio frequency transponder may contains additional data about the vehicle which is communicated to the server computer 140 and may be stored in one or more databases. Accordingly, the server computer 140 may be programmed and/or configured to communicate with the controller such that the automated valve opens for only certain vehicles equipped with a specific subset of radio frequency transponders.

In the non-limiting embodiment or aspect shown in FIG. 1, the system comprises a flow meter 122 which may measure the flow rate and/or volume of the fluid 124 transferred between the reservoir 125 and the tank 112. As shown, the flow meter 122 is in communication with the server computer 140 via the network switch 134. The flow meter 122 may communicate to the server computer 140 the flow rate, the flow volume, the time flow begins, the duration of flow, and/or the time flow ends, and the server 140 may store this information and generate a report that is accessible to a user. Optionally, the server computer 140 may be further configured to cause the automated valve 120 or open or close based on this information.

The control unit 138 may communicate to the server computer 140 information and/or data received from various components of the system including, but not limited to, the flow meter 122, the automated valve 120, the second communicating member 132, and/or the first communicating member 130. The transmitted information and/or data may include information associated with the vehicle 110, such as an identity of the vehicle, an identity of the driver, a company or user group name, a vehicle number, a vehicle capacity, a driver name, various identifiers, and/or other like information and/or data. The information may further include information associated with the reservoir 125, such as a type of fluid at that location, a name of the pick-up location, geographic coordinates (e.g., longitude and latitude) for the location, an available vehicle capacity, and/or an amount of fluid transferred. Additionally, this information may further include information about the connection between the groundwire 126 and the grounding unit 128, and/or the fluid transfer between the reservoir 125 and the tank 112 including, but not limited to, the time at which the groundwire 126 was connected to the grounding unit 128, the duration for which the groundwire 126 was connected to the grounding unit 126, and/or the time at which the groundwire 126 was disconnected from the grounding unit 128.

The server computer 140 may communicate this information and/or data via a transmitter 142 to a mobile device 146. This communication can either be made directly to the mobile device 146 or via a network such as a cellular network, a satellite network, and/or the Internet. For example, information may be made available through one or more web-based portals. One or more of the server computer 140, the mobile device 146 or, in embodiments or aspects utilizing a network, another computer in communication with the network, may store this information and generate a report that can be accessed by a user at a later time.

Further, in non-limiting embodiments or aspects, the system 1000 may be equipped with override systems for causing an automated valve to open. Such override systems may include, but are not limited to, a command from the server computer or another processor in communication with the automated valve, an override key in the form of a communicating member that may not be attached to a groundwire, and/or an override switch that is generally hidden from vehicle operators. In one preferred and non-limiting embodiment or aspect, an override key in the form of a communicating member may be attached to a keychain and given to a site manager.

In a non-limiting embodiment or aspect, a locking arrangement may be used in addition to a valve adapted to be manually opened and closed. For example, the locking arrangement may prevent a valve from being manually opened unless the groundwire is connected to the grounding unit. The locking arrangement may include a controller programmed and/or configured to actuate a locking mechanism that selectively blocks and allows movement of a valve, or an actuator for a valve, in response to receiving a command or making a determination. The locking arrangement may be in a locked position by default, and a controller may determine that the groundwire is connected to the grounding unit and send a signal to the locking mechanism causing the locking mechanism to allow manual actuation of the valve. It will be appreciated that manual actuation of a valve may be prevented in various other ways.

In a further non-limiting embodiment or aspect, alternatively to or in addition to restricting the flow of the fluid, the system 1000 may be configured to provide a real-time warning to a site manager via the server computer and/or a mobile device in communication with the system if it is determined that that fluid transfer has occurred, is occurring, or is about to occur without the groundwire being properly connected to the grounding unit. Additionally, in yet another non-limiting embodiment or aspect, alternatively to or in addition to restricting the flow of the fluid, the system 1000 may be configured to provide a real-time warning to a site manager if a mechanical switch or other sensor in communication with the system on the manifold 200 indicates that a hose or other such conduit from the tank has been connected thereto without the groundwire being first connected to the grounding unit.

Additionally, the system 1000 may further comprise a camera unit in communication with the grounding unit, the flowmeter, the automated valve, a communicating member, and/or a computer in communication with the system. The camera unit may be configured to record or cease recording based on one or more of the following determinations: whether a hose or other conduit has been connected from the tank to the manifold 200, whether the groundwire is connected to the grounding unit, whether a flowmeter has determined that a fluid is being transferred between the tank and the reservoir, whether an automated valve is open, and/or whether an override mechanism has been activated. For example, in one non-limiting embodiment or aspect, the camera unit is configured to take a picture of the operating site when the groundwire is connected or after a predetermined time period thereafter. In another non-limiting embodiment or aspect, the camera unit is a video camera configured to constantly record footage. The video camera, or a computer connected thereto, may delete video footage at regular intervals, and may retain certain footage based on data received from the grounding unit, the flowmeter, the automated valve, a communicating member, and/or a computer in communication with the system. For example, a signal may be sent to the camera unit when it is determined that the groundwire is connected to the grounding unit. In response to such a determination, the video camera may be configured to retain footage beginning at a predetermined time before the groundwire was connected to the grounding unit and ending at a predetermined time after the groundwire has been disconnected from the grounding unit, as an example. This footage may be communicated to the server computer to allow a user to monitor the reservoir site from a remote location during fluid transfer and may be stored so that the footage can be reviewed at a later date.

Additionally, the system 1000 may further comprise a resistance meter in communication with the at least one processor, wherein the at least one processor is configured to determine whether the resistance of an electrical connection between the vehicle and the grounding unit is below a predetermined threshold. Further, the at least one processor's determination as to whether the groundwire is connected to the grounding unit may be based, at least partially, upon the determination as to whether the resistance of the electrical connection between the vehicle and the grounding unit is below a predetermined threshold.

FIGS. 2-5 depict a non-limiting embodiment or aspect of the present invention wherein several elements including the grounding unit 128, coupling 118, manual valve 119, check valve 123, flowmeter 122, automated valve 120, and controller 136 are consolidated on a manifold 200, which includes at least a portion of the fixed conduit 117.

Figure 2:
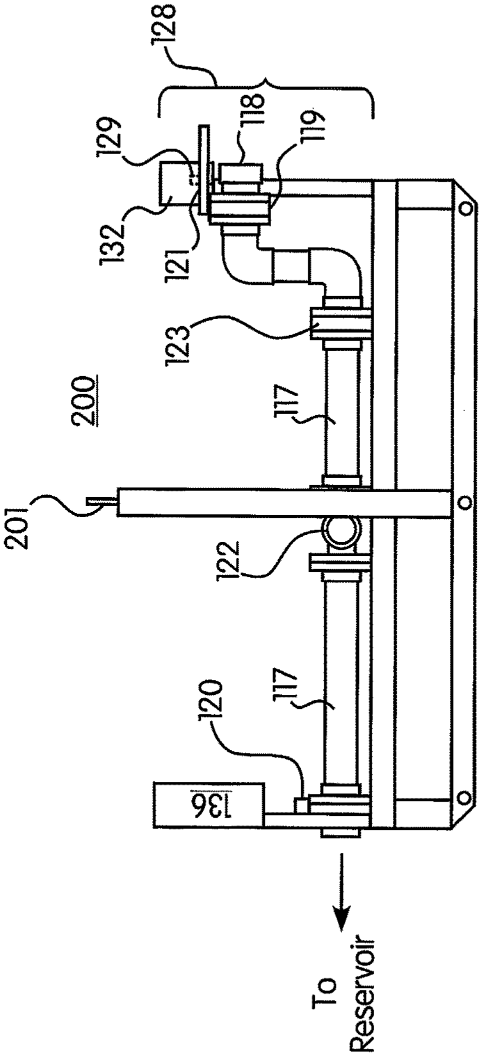
FIG. 2 shows a side view of a manifold in accordance with a non-limiting embodiment or aspect according to the principles of the present invention.
Figure 3:
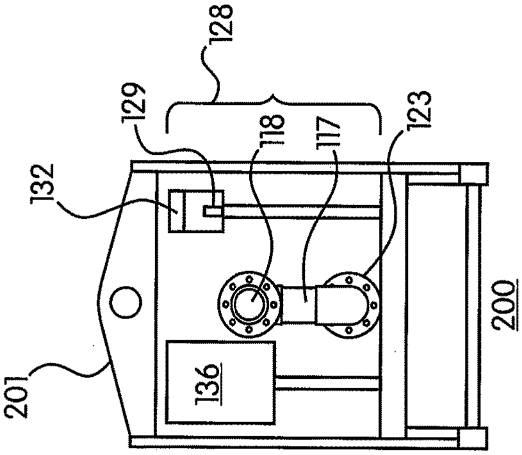
FIG. 3 shows a front view of the manifold shown in FIG. 2.
Figure 5:
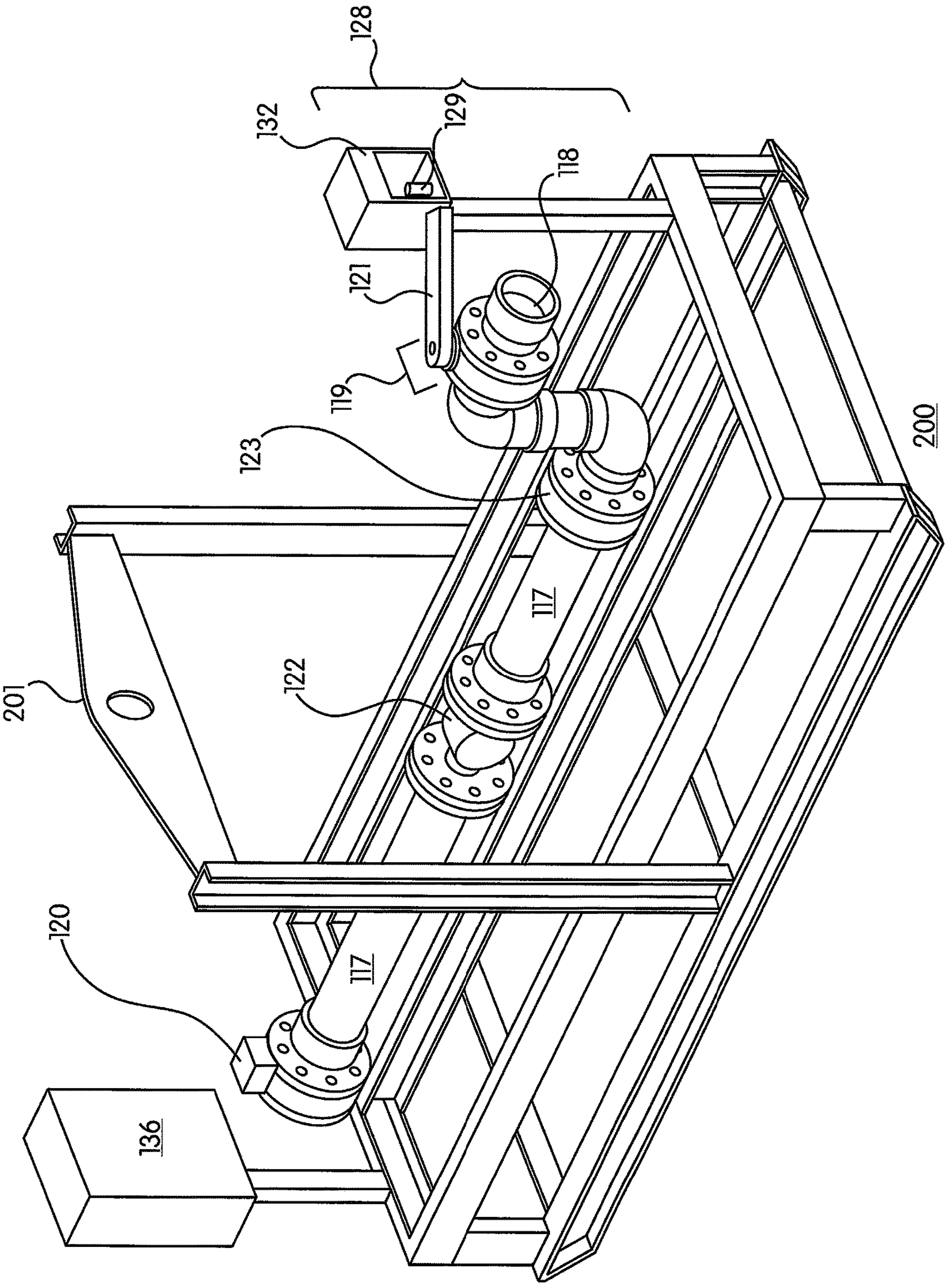
FIG. 5 shows a 3-dimensional illustration of the manifold shown in FIGS. 2-4.

As can be seen in FIGS. 2 and 5, the grounding unit 128 may comprise a connecting portion 129 to which the groundwire 126 may be connected, located proximate to the radio frequency reader 132. Additionally, the manual valve 119 may comprise a lever 121, such that the user may manually open and close the valve by turning the lever 121. Further, the non-limiting embodiment or aspect shown in FIGS. 2-5 includes a check valve 123, which allows the fluid to flow in only one direction, and a lift point 201, which aids in moving the manifold assembly prior to installation.

Additionally, the manifold may further comprise a camera unit in communication with the grounding unit, the flowmeter, the automated valve, either communicating member, and/or a computer in communication with the system. The camera unit may be configured to record or cease recording based on one or more of the following determinations: whether the hose or other conduit has been connected from the tank to the manifold, whether the groundwire is connected to the grounding unit, whether the flowmeter has determined that a fluid is being transferred between the tank and the reservoir, whether the automated valve is open, and/or whether an override mechanism has been activated.

This invention has been described with reference to the preferred embodiments or aspects. Obvious modifications and alterations will occur to others upon reading and understanding the preceding detailed description. It is intended that the invention be construed as including all such modifications and alterations.

The invention claimed is:

1. A system for verifying a groundwire connection prior to transferring a fluid between a tank and a reservoir, comprising:

- a first communicating member adapted to be attached to a groundwire of a first vehicle, the first vehicle comprising the tank;
- a grounding unit configured to electrically ground the first vehicle when the groundwire is connected thereto;
- a second communicating member attached to the grounding unit;
- a third communicating member adapted to be attached to a second groundwire connected to a second vehicle, the second vehicle comprising a second tank; and
- at least one processor in communication with at least one of the first communicating member and the second communicating member, the at least one processor programmed and/or configured to:
  - determine whether the groundwire or the second groundwire is connected to the grounding unit based at least partially upon data received from at least one of the following: the first communicating member, the second communicating member, the third communicating member, or any combination thereof;
  - determine which of the first and second vehicles is connected to the grounding unit; and
  - facilitate fluid transfer between the tank of the first vehicle or the second tank of the second vehicle and the reservoir in response to determining that the groundwire or the second groundwire is connected to the grounding unit.

2. The system of claim 1, further comprising a valve in communication with the at least one processor, the valve configured to restrict the flow of the fluid between the reservoir and the tank, wherein facilitating the fluid transfer between the tank and the reservoir comprises opening the valve or releasing a locking arrangement that allows for the valve to be manually opened.

3. The system of claim 2, wherein the valve is adapted to be opened manually, and wherein the at least one processor is further programmed and/or configured to prevent, with the locking arrangement, the valve from being manually opened when the groundwire is not connected to the grounding unit.

4. The system of claim 1, wherein at least one of the first communicating member and the second communicating member comprises at least one receiver adapted to receive at least one of the following: a radio frequency, barcode data, or any combination thereof.

5. The system of claim 1, wherein at least one of the first communicating member and the second communicating member comprises at least one of the following: a radio frequency transmitter, a Bluetooth transmitter, a near field communication transmitter, a barcode, or any combination thereof.

6. The system of claim 1, wherein the at least one processor is further programmed and/or configured to determine at least one of the following: a time at which the groundwire is connected to the grounding unit, a time at which the groundwire is disconnected from the grounding unit, the duration for which the groundwire is attached to the grounding unit, or any combination thereof.

7. The system of claim 1, further comprising a manifold connected to the reservoir and the tank such that the fluid can flow between the tank and the reservoir via the manifold, wherein the manifold comprises at least one of the following: the grounding unit, an automated valve, a flow meter, or any combination thereof.

8. The system of claim 1, wherein the second communicating member comprises a receiver, wherein the first communicating member comprises a transmitter, and wherein the second communicating member is in communication with the at least one processor.

9. The system of claim 1, further comprising a flow meter in communication with the at least one processor, wherein the at least one processor is further programmed and/or configured to determine at least one of a flow rate and a flow volume of the fluid transferred between the reservoir and the tank.

10. The system of claim 1, further comprising a second grounding unit comprising another communicating member in communication with the at least one processor, wherein the at least one processor is further programmed and/or configured to determine which of the first and second grounding units the first vehicle is connected to.

11. The system of claim 1, wherein the at least one processor is further programmed and/or configured to communicate, to at least one remote server computer via at least one network, at least one of the following: a time at which the groundwire is connected to the grounding unit, a time at which the groundwire is disconnected from the grounding unit, a duration for which the groundwire has been connected to the grounding unit, a flow rate of a fluid between a reservoir and a tank located on the first vehicle, a volume of a fluid that has been transferred between a reservoir and a tank located on the first vehicle, an identity of the first vehicle, or any combination thereof.

12. The system of claim 1, wherein the at least one processor is further programmed and/or configured to record at least one of the following: an identity of the first vehicle, a driver of the first vehicle, an indication as to whether the groundwire had been connected to the grounding unit during fluid transfer, or any combination thereof.

13. A method for verifying a groundwire connection prior to transferring a fluid between a tank and a reservoir using a grounding unit configured to electrically ground a vehicle, comprising:

- determining, with at least one processor, whether a first groundwire associated with a first vehicle or a second groundwire associated with a second vehicle is connected to the grounding unit based at least partially on data received from at least one communicating member affixed to at least one of the following: the first groundwire, the second groundwire, the grounding unit, or any combination thereof;
- in response to determining that the first groundwire or the second groundwire is connected to the grounding unit, causing or allowing a valve to be opened such that fluid is permitted to flow between the reservoir and a tank associated with the first vehicle or the second vehicle; and
- in response to determining that the first groundwire or the second groundwire is not connected to the grounding unit, causing or forcing the valve to remain closed with a locking arrangement such that fluid is not permitted to flow between the reservoir and the tank.

14. The method of claim 13, further comprising determining, using a flow meter, at least one of a rate of flow and a volume of flow of the fluid transferred between the reservoir and the tank.

15. The method of claim 13, further comprising determining, with at least one processor, at least one of the following: a time at which the first groundwire or the second groundwire is connected to the grounding unit, a time at which the first groundwire or the second groundwire is disconnected from the grounding unit, the duration for which the first groundwire or the second groundwire is attached to the grounding unit, or any combination thereof.

16. The method of claim 13, further comprising communicating, to at least one server computer via at least one network, at least one of the following: a time at which the first groundwire or the second groundwire is connected to the grounding unit, a time at which the first groundwire or the second groundwire is disconnected from the grounding unit, a duration for which the first groundwire or the second groundwire has been connected to the grounding unit, a flow rate of a fluid between a reservoir and a tank located on the first vehicle, a volume of a fluid that has been transferred between a reservoir and a tank located on the first vehicle, an identity of the first vehicle, or any combination thereof.

17. The method of claim 13, further comprising:

recording an identity of a vehicle or the driver of the vehicle in at least one database; and recording an indication that the first groundwire or the second groundwire has been connected to the grounding unit in the at least one database.

18. An apparatus adapted to restrict the flow of a fluid between a tank and a reservoir based on a groundwire connection, comprising:

a grounding unit adapted to electrically ground a vehicle when a vehicle groundwire is connected thereto;

a conduit having a first end adapted to be releasably connected to a tank of the vehicle, a second end adapted to be connected to a reservoir, and a valve therebetween, wherein the valve is configured to be opened manually and to restrict the flow of the fluid between the reservoir and the tank, the valve comprising a locking arrangement; and at least one processor programmed or configured to prevent, with the locking arrangement, the valve from being manually opened when the groundwire is not connected to the grounding unit.

19. The apparatus of claim 18, wherein the conduit further comprises at least one of a second valve adapted to be manually opened or closed by a user, and a check valve configured to restrict the flow of the fluid from the reservoir to the tank or from the tank to the reservoir.

20. The apparatus of claim 18, further comprising a flow meter adapted to measure at least one of a rate of flow and a volume of flow of a fluid through the conduit.

21. The apparatus of claim 18, wherein at least one of the grounding unit and the automated valve is adapted to communicate to at least one processor at least one of the following: a time at which the groundwire is connected to the grounding unit, a time at which the groundwire is disconnected from the grounding unit, a duration for which the groundwire has been connected to the grounding unit, an identity of the vehicle associated with the groundwire, or any combination thereof.

22. The apparatus of claim 20, wherein the flow meter is adapted to communicate to at least one processor at least one of the following: a rate of flow of a fluid through the conduit, a volume of flow of a fluid through the conduit, an indication that a fluid is flowing through the conduit, a time at which a fluid began flowing through the conduit, a time at which a fluid ceased flowing through the conduit, a duration for which a fluid flowed through the conduit, or any combination thereof.

23. The apparatus of claim 18, wherein the valve comprises an automated valve configured to automatically open when the vehicle groundwire is connected to the grounding unit.

24. A system for verifying a groundwire connection prior to transferring a fluid between a tank and a reservoir, comprising:

a first communicating member adapted to be attached to a groundwire of a vehicle, the vehicle comprising the tank;

a first grounding unit configured to electrically ground the vehicle when the groundwire is connected thereto;

a second communicating member attached to the first grounding unit;

a second grounding unit configured to electrically ground the vehicle when the groundwire is connected thereto;

a third communicating member attached to the second grounding unit; and at least one processor in communication with at least one of the first communicating member, the second communicating member, and the third communicating member, the at least one processor programmed and/or configured to:

determine whether the groundwire is connected to the grounding unit based at least partially upon data received from at least one of the first communicating member, the second communicating member, and the third communicating member;

determine which of the first grounding unit and the second grounding unit the vehicle is connected to; and facilitate fluid transfer between the tank and the reservoir in response to determining that the groundwire is connected to the first grounding unit or the second grounding unit.

* * * * *